United States Patent

Goodall

[15] 3,646,477

[45] Feb. 29, 1972

[54] MEANS FOR RAPIDLY SWITCHING TUNED CIRCUITS OF VARIABLE-FREQUENCY OSCILLATORS FROM ONE STATE TO ANOTHER

[72] Inventor: Laurence Goodall, Egham, England

[73] Assignee: Ferranti, Limited, Lancashire, England

[22] Filed: Jan. 29, 1970

[21] Appl. No.: 6,695

[30] Foreign Application Priority Data

Feb. 1, 1969 Great Britain ........................5,558/69

[52] U.S. Cl. ..........................331/117 R, 331/167, 331/179, 332/16, 334/47

[51] Int. Cl. ..........................................................H03b 5/12

[58] Field of Search...........331/179, 117 R, 177 R, 167–171; 332/16, 29; 325/163; 334/47

[56] References Cited

UNITED STATES PATENTS

| | | | |
|---|---|---|---|
| 3,386,051 | 5/1968 | Widl | 331/179 X |
| 3,076,154 | 1/1963 | Rappold et al. | 331/177 |

*Primary Examiner*—Roy Lake
*Assistant Examiner*—Siegfried H. Grimm
*Attorney*—Cameron, Kerkam & Sutton

[57] ABSTRACT

A variable-frequency oscillator includes a tuned circuit and a switch having two positions. In one position the tuned circuit is completed, and in the other position the tuned circuit is interrupted and the energy stored in it remains substantially constant. Switch drive means are provided to either maintain the switch in said one position or to cause it to alternate repetitively between the two positions at a rate considerably greater than the frequency of oscillation of the tuned circuit.

4 Claims, 5 Drawing Figures

MEANS FOR RAPIDLY SWITCHING TUNED CIRCUITS OF VARIABLE-FREQUENCY OSCILLATORS FROM ONE STATE TO ANOTHER

This invention relates to variable-frequency oscillators, and in particular to oscillators of the type which will generate signals at one or other of two different frequencies.

Oscillators which generate signals of two frequencies as required are used, for example, in frequency-shift keying (FSK) telegraphy. In FSK telegraphy the signal is made up of a series of "mark" and "space" signals, and the oscillator produces a first frequency representing the "mark" and a different frequency representing the "space."

Two types of oscillator are commonly used to produce the two signal frequencies. One of these is the multivibrator circuit, in which the aiming potential of the timing circuits may be changed to produce the alternative frequency. This type of oscillator tends to produce harmonics, and the low-pass filters used to remove these cause undesirable amplitude modulation and also slow down the response of the oscillator to changes in the required frequency.

The other common form of oscillator is the inductance-capacitance oscillator in which the oscillation frequency is changed by changing either the inductance or the capacitance, or both. This circuit also produces unwanted amplitude modulation, unless both the inductance and capacitance are changed simultaneously. However, this leads to more complex circuitry.

It is an object of the invention to provide a variable-frequency oscillator which does not produce unwanted amplitude modulation products, and which has a fast response.

According to the present invention there is provided a variable-frequency oscillator which includes a tuned-circuit oscillator the tuned circuit of which includes a switch having two positions in one of which the tuned circuit is completed and in the other of which the tuned circuit is interrupted while the energy stored therein is maintained substantially constant, and switch drive means operable in response to a control signal to either maintain the switch in the said one position or to cause the switch to alternate repetitively between said one and the other positions at a frequency considerably greater than the frequency of oscillation of the tuned circuit.

Figure 1A:
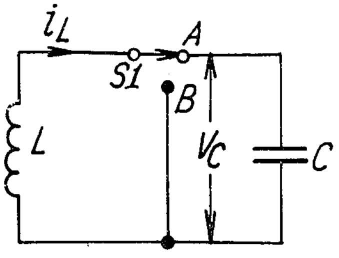
Figure 1B:
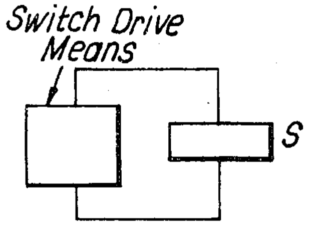
Figure 1C:
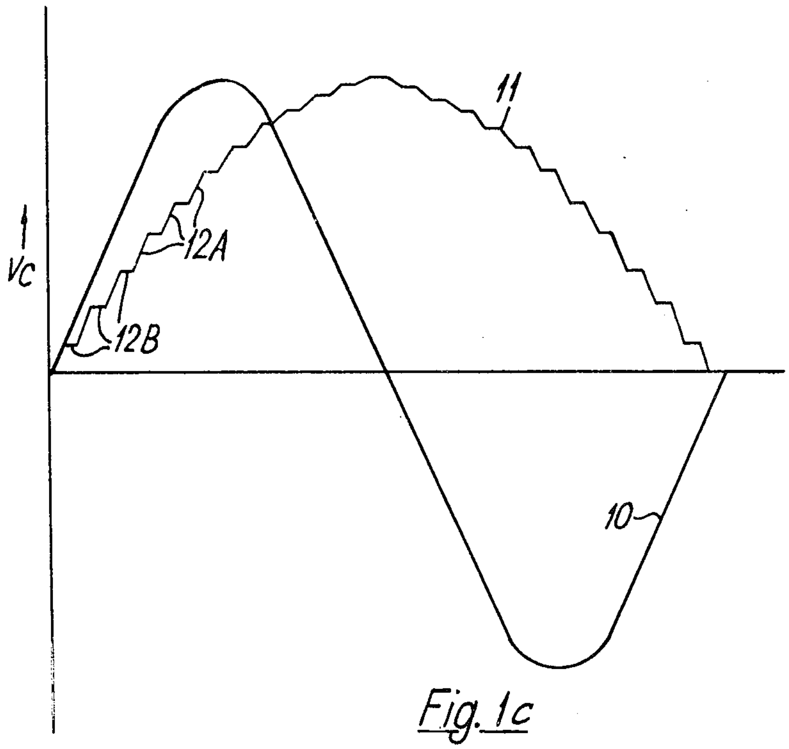
Figure 2:
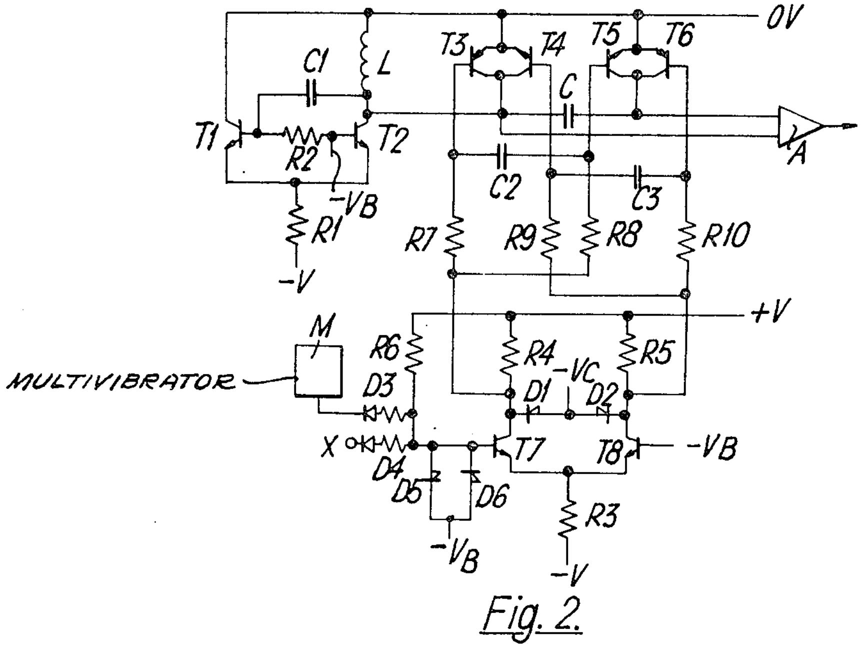
Figure 3:
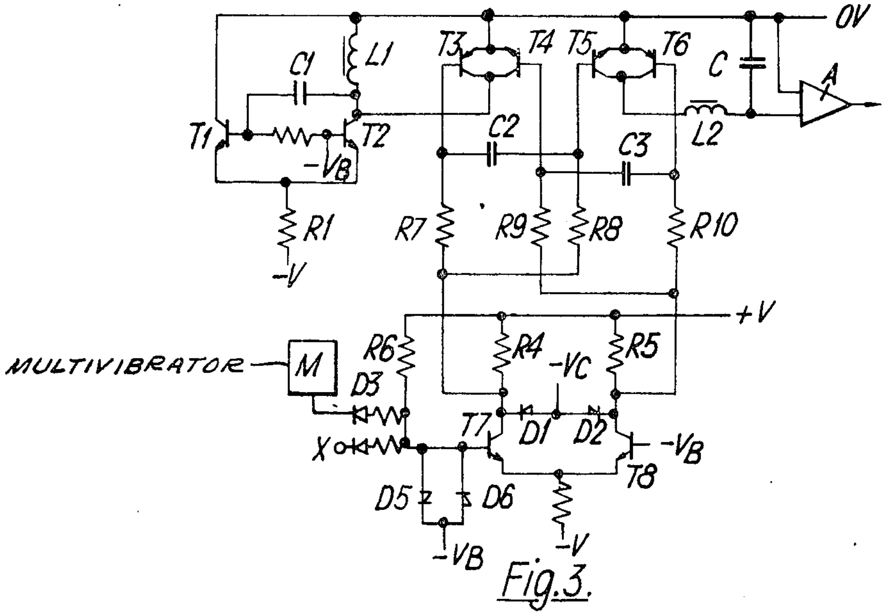

The invention will now be described with reference to the accompanying drawings, in which:

FIGS. 1*a*, 1*b*, and 1*c* illustrate the principle of operation;

FIG. 2 is a circuit diagram of one form of oscillator for an FSK telegraphy system; and FIG. 3 is a circuit diagram of an alternative form of oscillator.

Referring now to FIG. 1*a*, this shows a simple inductance-capacitance circuit with a changeover switch S1 connected between the two circuit components. In its other position the switch short circuits the inductor L and thus isolates the capacitor C. The switch S1 is shown in FIG. 1*b* as a relay contact, with the relay denoted by the reference S driven by the switch drive means.

For the purpose of illustrating the principle of operation of the invention it will be assumed that L and C are ideal loss-free components and that the switch relay S has an instantaneous action. If, while the switch S1 is in the position A shown, a quantity of energy is injected into the circuit, oscillations will occur at a frequency determined by the values of L and C, and a sinusoidal voltage $V_c$ of constant peak amplitude will appear across the capacitor C as shown at 10 in FIG. 1*c*. If, at any point during the cycle of oscillation, the switch S1 is moved to the other position B then the cycle of oscillation is interrupted. The capacitor C is isolated and the voltage $V_c$ will remain at whatever value existed at the instant of operation of the switch. At the same time the current $i_L$ flowing through the inductor L will be maintained via the closed switch contacts. Since ideal components have been assumed the voltage and current will maintain their values indefinitely, and the energy stored in the circuit remains constant.

When the switch again returns to the upper position A, oscillation is resumed, the voltage $V_c$ and current $i_L$ again changing in accordance with the cycle of operation. The effect is illustrated by curve 11 in FIG. 1c. Each inclined portion 12A of the waveform is parallel to the corresponding portion of curve 10, and is produced while the switch S1 is in a position A. When the switch is in position B the cycle of oscillation is interrupted and portion 12B of the curve 11 is produced. Hence if the switch S1 is moved cyclically there will be periods 12A during which the oscillator is functioning interspersed with quiescent periods 12B. If the frequency of operation of the switch S1 is sufficiently rapid compared with the frequency of oscillation, the the effect is to produce a generally sinusoidal curve 11 having a cycle time longer than that of the basic curve 10. If the natural frequency of oscillation of the circuit is $f_o$ Hz., then the reduced frequency $f$ due to the switching is given by $$f = Tu/T \times f_o \text{ Hz.}$$

where $T$ is the period of the switching cycle and $Tu$ is the time in each period for which the switch contact remains in the upper position shown.

The reduced-frequency waveform is essentially sinusoidal but has irregularities occurring at the instants of switching. These irregularities may be reduced by suitable choice of the switching frequency and by filtering. Preferably the switching frequency is at least 10 times the natural frequency of the oscillator.

It will be seen from the expression defining the frequency $f$ that this depends on the on-off or mark/space ratio of the switch operation rather than on the actual switching frequency, though as stated above the latter has an effect on the actual shape of the output wave form. The switch is operated by a switching waveform generated by the switch drive means.

FIG. 2 shows a circuit diagram of one embodiment of the invention, and illustrates its application to an FSK telegraphy system.

Two NPN-transistor T1 and T2 have their emitters connected together and through a common resistor R1 to a source of potential −V. The bases of the two transistors are connected together through a resistor R2 and the base of T2 is connected to a bias potential $-V_B$. The base of T1 is connected through a capacitor C1 to the collector of T2, which is also connected through an inductor L to zero potential. The collector of T1 is connected directly to the zero potential. Also connected to the collector of T2 are the common collectors of a pair of transistors. Transistors T3 and T4 are of opposite conductivity kinds and have their common collectors connected to the collector of T2 and their common emitters connected to the zero potential. The other pair of transistors T5 and T6 are also of opposite conductivity kinds and are similarly connected, except that a capacitor C is connected between the commoned collectors of T5 and T6 and the commoned collectors of T3 and T4. Connected to opposite ends of the capacitor C are the two inputs of a differential amplifier A, the output of which represents the output of the oscillator.

The two pairs of transistors T3, T4 and T5, T6 are controlled by a drive circuit. This includes NPN-transistors T7 and T8 connected as a long-tailed pair with their commoned emitters connected through a resistor R3 to the potential −V. The collectors of T7 and T8 are connected through resistors R4 and R5 respectively to a potential +V, and two diodes D1 and D2, poled as shown, are connected between the collectors of T7 and T8 respectively and a catching potential $-V_c$. The base of T8 is connected to the bias potential $-V_B$, while the base of T7 is connected through a gating network to a control terminal X and to a multivibrator M.

Terminal X is connected through diode D4 and a resistor to a resistor R6 and to the base of transistor T7. Similarly the multivibrator M is connected through diode D3 and a resistor to R6. The other end of R6 is connected to the potential +V. Two further diodes D5 and D6 are oppositely poled and connected in parallel with one another between the base of T7 and the bias potential $-V_B$. The collector of T7 is connected to the base of T3 through a resistor R7 and to the base of T5 through a resistor R8, and the bases of T3 and T5 are interconnected through a capacitor C2. Similarly the collector of T8 is connected to the base of T4 through a resistor R9 and to the base of T6 through a resistor R10, the bases of T4 and T6 being interconnected through a capacitor C3.

In the circuit described above transistors T1 and T2, together with inductor L and capacitor C, form a Class D oscillator. The two pairs of transistors T3, T4 and T5, T6 form the two contacts of the changeover switch S1 of FIG. 1*a*, the "switch" being operated by the drive circuit comprising T7 and T8.

The gating network connecting the multivibrator and terminal X to the base of T7 forms an AND gate. The DC FSK signal is applied to terminal X and acts as the control signal. Both this signal and the multivibrator output are square waves having maximum and minimum values of zero and $-2V_B$ respectively. By way of example only, an oscillator producing a natural frequency of 2,100 Hz. is made to produce a lower frequency of 900 Hz. by means of a 20-kHz. switching waveform of suitable mark/space ratio from the multivibrator.

Consider initially the situation in which no control signal is applied to terminal X. The gating circuit operates so that T7 will conduct only when both the control and switching signals are above $-V_B$. At all other times T8 conducts and T7 is nonconducting. Hence in the situation under consideration T7 conducts when the switching waveform rises above $-V_B$, and T8 conducts when the waveform falls below $-V_B$. When T7 is conducting, transistors T3 and T4 are also conducting and T5 and T6 are nonconducting. When T8 is conducting, T5 and T6 are also conducting and T3 and T4 are nonconducting. The "-switch" formed by the two pairs of transistors is operated at the frequency of the switching waveform, and the oscillator will deliver the lower of its two operating frequencies by the means described with reference to FIG. 1*a*.

If now the teleprinter producing the DC FSK signals is switched on but not keyed, the control input to terminal X will be permanently at $-2V_B$. This causes T8 to conduct continuously, and hence T5 and T6 also conduct continuously. Hence the oscillator now delivers its "natural" frequency, the upper of the two FSK signal frequencies.

When the teleprinter is keyed, the control signal applied to terminal X is a sequence of mark and space signals represented by the two DC potential levels, and the output frequency of the oscillator changes in accordance with the sequence.

The actual output is provided by the differential amplifier A which is connected across the capacitor C. As already stated a low-pass filter may be used to remove traces of the switching frequency if so desired.

The two capacitors C2 and C3 ensure that one pair of "-switch" transistors cannot conduct until the other pair has ceased to conduct when a changeover occurs. This ensures the necessary "break-before-make" operation of the switching circuit.

One disadvantage of the circuit of FIG. 2 is that neither side of the capacitor C is tied to a supply potential. This necessitates the use of a differential amplifier to obtain the output. FIG. 3 shows a modified circuit such that one side of the capacitor is connected to zero potential. The circuit is very similar to that of FIG. 2, and only the differences will be described.

The main difference is that the inductor L of FIG. 2 is replaced by two windings L1 and L2 on a common core. L2 and capacitor C form the tuned circuit, one side of which is connected to zero potential. Transistors T3 and T4 operate as before to short circuit the inductor L1, while transistors T5 and T6 make and break the connection between L2 and C. This arrangement enables a conventional single-input amplifier to be used since one side of the input is connected to zero potential.

The operation of the circuit is not affected by the modifications referred to above.

As already stated, the relationship between the upper and lower frequencies produced by the oscillator is dependent upon the mark/space ratio of the switching waveform from multivibrator M. Hence the lower frequency may be altered by changing the switching waveform shape. Thus by applying pulse width modulation techniques it is possible to obtain a range of lower oscillator frequencies (the upper frequency being the "natural" frequency of oscillation of the circuit).

The switching waveform may be produced by means other than the multivibrator shown in FIG. 2 and 3.

What I claim is:

1. A variable-frequency oscillator comprising a tuned circuit which includes inductance and capacitance of constant values, and a switch having two states in one of which the tuned circuit is completed and oscillates at a frequency determined by the values of said inductance and capacitance, and in the other of which the tuned circuit is interrupted and does not oscillate while the energy stored therein is maintained substantially constant, and switch drive means operable in response to a control signal either to maintain the switch in said one state or to cause the switch to alternate repetitively between said one and the other states at a frequency considerably greater than the frequency of oscillation of the tuned circuit.

2. An oscillator as claimed in claim 1 in which the switch is caused to alternate between said one and the other states at a rate at least 10 times the frequency at which the tuned circuit oscillates when the switch is in said one state.

3. A variable-frequency oscillator comprising a tuned circuit which includes inductance and capacitance of constant values, means for switching the tuned circuit back and forth between one state in which the tuned circuit is completed and oscillates at a frequency determined by the values of said inductance and capacitance, and another state in which the tuned circuit is interrupted and does not oscillate while the energy stored therein is maintained substantially constant, and means for driving the switching means operable in response to a control signal either to maintain the tuned circuit in said one state or to cause the tuned circuit to alternate repetitively between said one and the other states at a frequency considerably greater than the frequency of oscillation of the tuned circuit.

4. An oscillator as claimed in claim 3 in which the switching means causes the tuned circuit to alternate between said one and the other states at a rate at least 10 times the frequency at which the tuned circuit oscillates when it is in said one state.

* * * * *